United States Patent
Amo et al.

(10) Patent No.: US 6,798,006 B2
(45) Date of Patent: Sep. 28, 2004

(54) SEMICONDUCTOR DEVICE AND MANUFACTURING METHOD THEREOF

(75) Inventors: Atsushi Amo, Tokyo (JP); Atsushi Hachisuka, Tokyo (JP); Tatsuo Kasaoka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/455,371

(22) Filed: Jun. 6, 2003

(65) Prior Publication Data

US 2004/0129963 A1 Jul. 8, 2004

(30) Foreign Application Priority Data

Jan. 7, 2003 (JP) ......................................... 2003-001501

(51) Int. Cl.$^7$ ............................................. H01L 27/108
(52) U.S. Cl. ..................... 257/296; 257/296; 257/300; 257/304; 257/306; 257/308; 257/311; 438/238; 438/239; 438/386; 438/399
(58) Field of Search ................................ 257/296, 300, 257/304, 306, 308, 311; 438/238, 239, 386, 399

(56) References Cited

U.S. PATENT DOCUMENTS

| | | | | |
|---|---|---|---|---|
| 6,031,271 A | * | 2/2000 | Imai | 257/393 |
| 6,121,080 A | * | 9/2000 | Wu | 438/238 |
| 6,320,777 B1 | | 11/2001 | Lines et al. | |
| 6,331,379 B1 | * | 12/2001 | Ireland et al. | 430/314 |
| 6,512,299 B1 | * | 1/2003 | Noda | 257/774 |
| 6,563,158 B1 | * | 5/2003 | Houston et al. | 257/296 |

* cited by examiner

*Primary Examiner*—Jerome Jackson
*Assistant Examiner*—Edgardo Ortiz
(74) *Attorney, Agent, or Firm*—Leydig, Voit & Mayer, Ltd.

(57) ABSTRACT

A semiconductor device includes a diffusion region in a semiconductor substrate, a gate insulation film on the semiconductor substrate, a gate electrode on the gate insulation film, an interlayer insulation film on the semiconductor substrate covering the gate electrode, and a capacitor on the interlayer insulation film. The capacitor includes a laminated structure made up of a lower electrode, a dielectric film, and an upper electrode. The diffusion region, the gate electrode, and the lower electrode are connected to one another by a common contact in the interlayer insulation film.

16 Claims, 14 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Background Art

Conventional T-CAMs (Ternary Contents Addressable Memories) generally use SRAMs (Static Random Access Memories) as their memories for storing information, and such T-CAMs have been available commercially. However, each cell of this type of T-CAM using SRAMs requires as many as 16 transistors (6 transistors for each of the two CMOS-SRAMs and 4 "search transistors"), resulting in increased cell area.

To solve the above problem, attempts have been made to adopt DRAMs (Dynamic Random Access Memories) for the storage memory section, as described in, for example, U.S. Pat. Nos. 6,320.777 and 6,262,907.

FIG. 18 shows a diagram (originally FIG. 7A) taken from the above U.S. Pat. No. 6,320.777 for reference, illustrating the layout of a half-bit memory cell of a T-CAM.

Referring to FIG. 18, the memory cell includes a diffusion layer 1801 for a DRAM storage memory of one bit and a diffusion layer 1802 for search transistors. Reference numeral 1803 denotes a word line; 1804 denotes the gate electrode of a search transistor turned on and off by the information stored in the storage memory; and 1805 denotes the gate electrode of another search transistor turned on and off through a search line. Reference numeral 1806 denotes a storage node contact hole which connects between the memory cell transistor diffusion layer 1801, which has the word line 1803, and a storage node 1814. Furthermore, reference numerals 1807 to 1812 denotes contact holes formed in a process different from that for the storage node contact hole 1806.

The potential written in (applied to and held by) the storage node 1814 is transmitted to the search transistor gate electrode 1804 through a wire 1813 and a contact hole 1808 from the contact hole 1807 in the diffusion layer 1801 in which the storage node contact hole 1806 is also formed.

Further referring to FIG. 18, the contact holes 1809 to 1812 are connected to a bit line, a discharge line, a match line, and a search line (all not shown), respectively.

Only when the search transistor with the gate electrode 1804 is turned on by a high state (potential) written in the storage node 1814 and furthermore the search line (not shown) is set to a high state (potential) for search operation, are the two series-connected search transistors turned on at the same time. This turning-on of the two search transistors connects between the precharged match line and the discharge line, so that the potential of the match line is brought to that of the discharge line. Otherwise, since at least one of the two search transistors is off, the potential of the match line does not change. Each unit cell of a CAM is made up of a single cell operating as described above, while each unit cell of a T-CAM is made up of two cells each operating as described above.

The cell area of T-CAMs can be reduced to some extent by using DRAMs as their storage memories, instead of SRAMs. However, it is desirable to further reduce the cell area.

The arrangement shown in FIG. 18, however, employs one storage node contact hole (1806), two contact holes (1807, 1808), and a wire (1813) in order to set the storage node 1814 and the search transistor gate electrode 1804 at the same potential. Therefore, it is not possible to further reduce the cell area since the layout space for these contact holes and the wire must be provided.

Furthermore, in the manufacturing process of (such) semiconductor devices, it is necessary to open all of the storage node contact hole 1806 and the contact holes 1807 and 1808 as well as preventing shorting between the wire 1813 and other wires. Therefore, the above layout is disadvantageous also from the viewpoint of production yield.

SUMMARY OF THE INVENTION

The purpose of the present invention is to provide a semiconductor device and a manufacturing method thereof capable of reducing the layout area for connecting between the storage node and the gate electrode having the same potential as the storage node Another purpose of the present invention is to provide a semiconductor device and a manufacturing method thereof capable of realizing high production yield by a simple structure.

Other purposes and advantages of the present invention will become apparent from the following description.

According to one aspect of the present invention, a semiconductor device comprises a diffusion layer formed in a semiconductor substrate, a gate insulation film formed on the semiconductor substrate, a gate electrode formed on the gate insulation film, an interlayer insulation film formed on the semiconductor substrate so as to cover the gate electrode, and a capacitor formed on the interlayer insulation film and having a laminated structure made up of a lower electrode, a dielectric film, and an upper electrode. The diffusion layer, the gate electrode, and the lower electrode are connected to one another by a common contact formed in the interlayer insulation film.

According to another aspect of the present invention, in a method for manufacturing a semiconductor device, a P-well region is formed in a semiconductor substrate. A gate insulation film is formed on the P-well region. A gate electrode is formed on the gate insulation film. A diffusion layer is formed in the P-well region of both sides of the gate electrode. The diffusion layer is used as a source/drain region. A sidewall is formed on both sides of the gate electrode and the gate insulation film. An insulation film is deposited on the diffusion layer, thereby an interlayer insulation film for covering the gate electrode and the sidewall is obtained. The interlayer insulation film is etched to form a contact hole reaching the diffusion layer and the gate electrode. The contact hole is filled with an impurity doped polysilicon to form a contact. A lower electrode, a dielectric film, and an upper electrode are laminated on the contact in that order to form a capacitor.

According to other aspect of the present invention, in a method for manufacturing a semiconductor device, a P-well region is formed in a semiconductor substrate. A gate insulation film is formed on the P-well region. A gate electrode is formed on the gate insulation film. A shallow diffusion layer is formed in the P-well region of both sides of the gate electrode. The shallow diffusion layer is used as a source/drain region. A sidewall is formed on both sides of the gate electrode and the gate insulation film after the step of forming the shallow diffusion layer. A deep diffusion layer is formed in the P-well region of both sides of the sidewall. The deep diffusion layer is used as a source/drain region. The tops of the deep diffusion layer and the gate electrode are silicifyed. An insulation film is deposited on the deep diffusion layer, thereby an interlayer insulation film for covering the gate electrode and the sidewall is obtained. The interlayer insulation film is etched to form a contact hole reaching the deep diffusion layer and the gate electrode. The barrier metal layer is formed inside the contact hole. The contact hole is filled with tungsten to form a contact. A lower electrode, a dielectric film, and an upper electrode are laminated on the contact in that order to form a capacitor.

Other and further objects, features and advantages of the invention will appear more fully from the following description.

DETAILED DESCRIPTION OF THE PREFERRED EMBODIMENTS

Preferred embodiments of the present invention will be described below in detail with reference to the accompanying drawings.

First Embodiment

Description will be made of a semiconductor device according to a first embodiment of the present invention with reference to FIG. 1 and FIGS. 2A and 2B.

Figure 1:
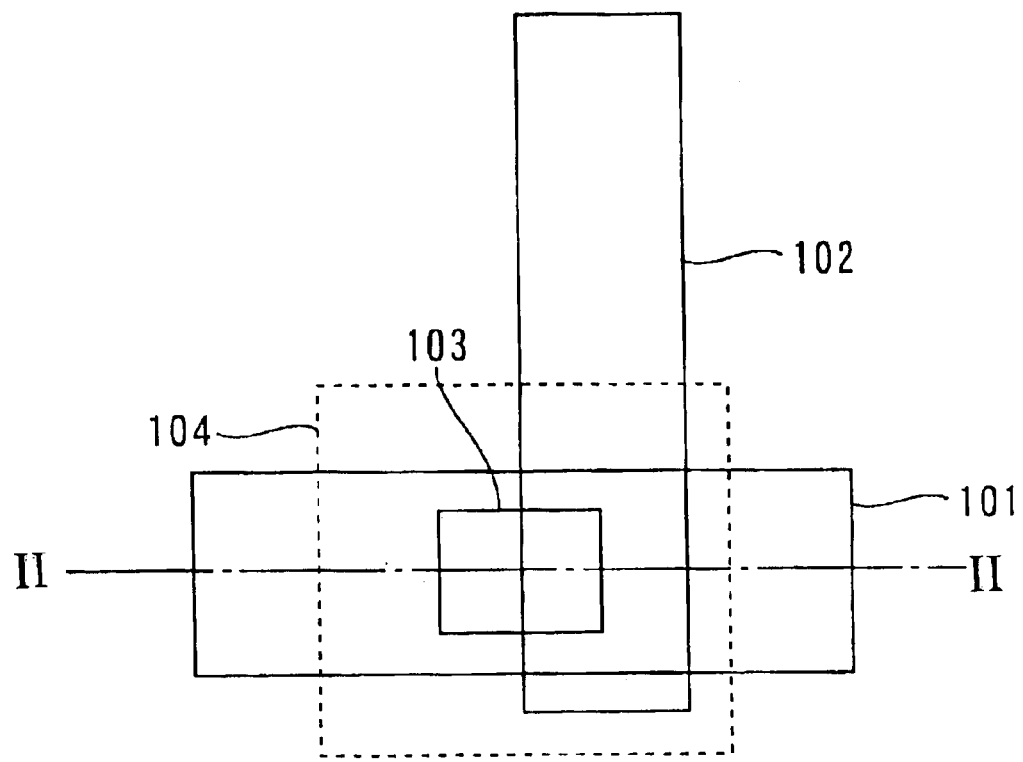
FIG. 1 shows a semiconductor device according to the first embodiment.

FIG. 1 is a plan view of the semiconductor device according to the first embodiment. FIGS. 2A and 2B are cross-sectional views of the semiconductor device shown in FIG. 1 taken along line II—II of FIG. 1. the present embodiment is characterized in that it includes a diffusion layer 101, a gate electrode 102, and a storage node 104 all connected by way of a common contact 103. It should be noted that as used in the following description of the present invention, the term "diffusion layer" refers to an impurity diffusion layer.

Figure 2A:
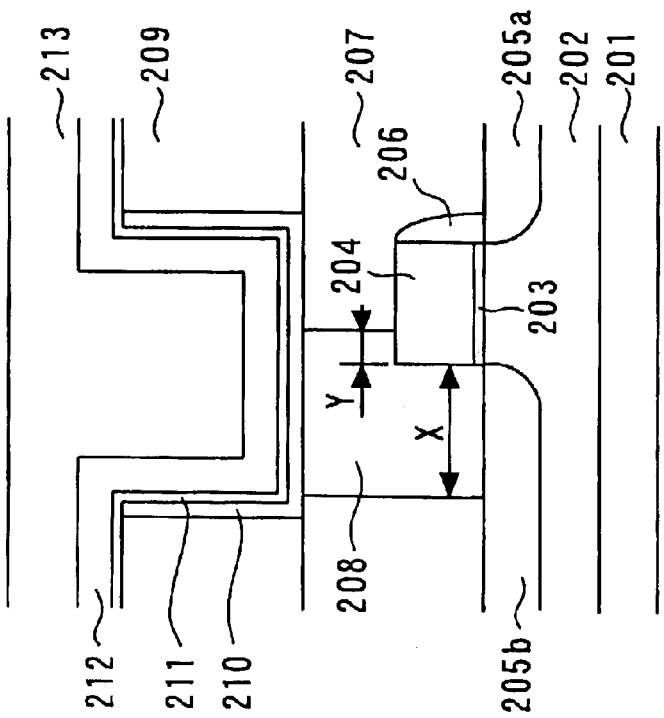
FIG. 2A shows a semiconductor device in the case of X=Y according to the first embodiment.

Specifically, as shown in FIG. 2A, the semiconductor device of the present embodiment includes a P-well region 202, a gate insulation film 203, a gate electrode 204, N-type diffusion layers 205a and 205b, a sidewall 206, and an interlayer insulation film 207 which are all formed above a P-type semiconductor substrate 201.

The N-type diffusion layers 205a and 205b are used as (or turned into) a source or drain region and are formed as a result of implanting an N-type impurity such as phosphor (P) or arsenic (As) in the P-well region 202.

The gate insulation film 203 is formed on the P-well region 202 between the N-type diffusion layers 205a and 205b. For example, a silicon oxide film, a silicon nitride film, or a silicon oxynitride film may be used as the gate insulation film.

The gate electrode 204 may be made of, for example. polysilicon doped with an N-type impurity. It should be noted that the portions of the gate electrode 204 shown in FIGS. 2A and 2B function as wires and are not used for any transistor operation.

The sidewall 206 is formed on side surfaces of the gate insulation film 203 and the gate electrode 204, and is made up of, for example, a silicon oxide film or a silicon nitride film. The sidewall on the gate electrode 204 on the side on which the gate electrode 204 is in contact with a contact 208 is removed after it is formed.

The interlayer insulation film 207 is made up of, for example, a silicon oxide film, a silicon nitride film, or a silicon oxynitride film. As shown in FIG. 2A, the contact 208 is formed in the interlayer insulation film 207. The contact 208 is made of, for example, polysilicon doped with an N-type impurity.

Referring to FIG. 2A, the underside of the contact 208 is in contact with the N-type diffusion layer 205b and the upper and side surfaces of the gate electrode 204. Even though two sidewalls are formed, only the sidewall 206 formed on the side on which the gate electrode 204 is in contact with the interlayer insulation film 207 is left (not removed). The sidewall on the "contact 208" side is removed at the time of etching after it is formed. The top of the contact 208, on the other hand, is connected with a storage node 210 constituting the capacitor lower electrode. The storage node 210 is made of, for example, polysilicon doped with an N-type impurity whose surface is roughened, and has a cylindrical shape.

Figure 2B:
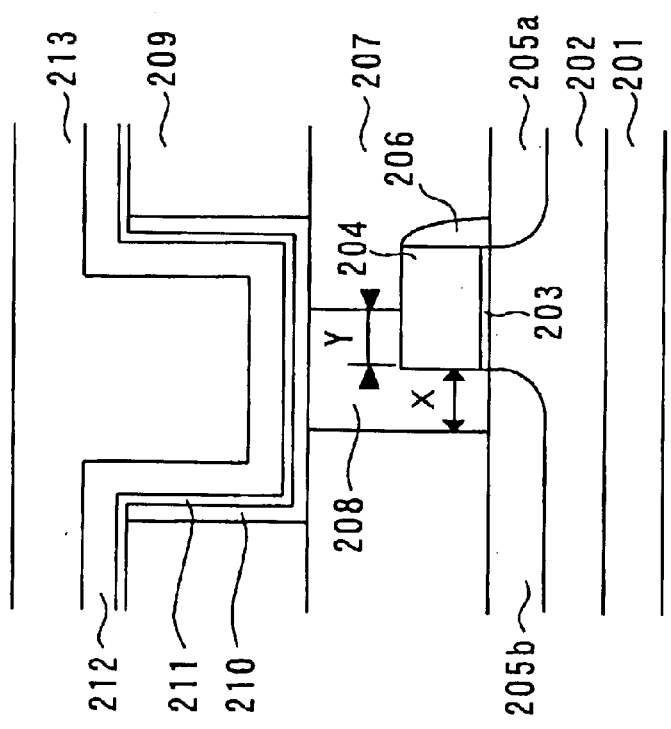

In FIGS. 2A and 2B, symbol X denotes the length of the contact portion between the contact 208 and the N-type diffusion layer 205b. Symbol Y denotes the length of the contact portion between the contact 208 and the top surface of the gate electrode 204. In FIG. 2A, X and Y are approximately equal, while in FIG. 2B, X is longer than Y.

According to the present embodiment, as shown in FIG. 2B, the contact 208 is preferably formed such that the length of the portion of the contact 208 in contact with the N-type diffusion layer 205b is longer than that in contact with the top surface of the gate electrode 204 (X>Y). With this arrangement, it is possible to make the area of the portion of the contact 208 in contact with the N-type diffusion layer 205b larger than that in contact with the top surface of the gate electrode 204.

Consider the case where only a single contact made of polysilicon doped with an N-type impurity is formed on an N-type diffusion layer and a gate electrode of N-type polysilicon. In such a case, it is known that if the contact area between the contact and the N-type diffusion layer is equal to that between the contact and the gate electrode, the contact resistance on the gate electrode is generally approximately 10% to 50% lower than that on the N-type diffusion layer.

Therefore, by forming the contact 208 such that X>Y, it is possible to reduce the contact resistance between the contact 208 and the N-type diffusion layer 205b while maintaining an equal (total) contact area, making it possible to manufacture a high-performance device.

More specifically, forming the contact 208 such that X>Y relatively increases the contact resistance between the contact 208 and the gate electrode 204. However, the contact resistance (between the contact 208 and the gate electrode 204) is intrinsically small, as compared with the contact resistance between the contact 208 and the N-type diffusion layer 205b (as described above). Accordingly, a reduction in the contact resistance between the contact 208 and the N-type diffusion layer 205b has greater influence on the total contact resistance than does an increase in the contact resistance between the contact 208 and the gate electrode 204. Therefore, it is possible to reduce the total contact resistance as a whole.

However, it is not desirable to reduce X to such an extent that the increase in the contact resistance between the contact 208 and the gate electrode 204 exceeds the reduction in the contact resistance between the contact 208 and the N-type diffusion layer 205b. Furthermore, setting the value of X too small might cause the contact 208 to "slip from" the gate electrode 204 when the contact 208 is formed.

Therefore, the minimum value of X is preferably determined by: (1) limiting the increase in the contact resistance between the contact and the gate electrode within the allowable value, and (2) taking into account the margins for alignment and dimensional changes in the contact manufacturing process.

The capacitor is made up of: a storage node 210 constituting the lower electrode; a dielectric film 211; and a cell plate 212 constituting the upper electrode. The capacitor is formed on the interlayer insulation film 207. An interlayer insulation film 209 is formed on both sides of the capacitor, while an interlayer insulation film 213 is formed over the capacitor.

The interlayer insulation film 209 may be made up of, for example, a silicon oxide film, a silicon nitride film, or a silicon oxynitride and is formed on the interlayer insulation film 207.

The storage node 210 is formed such that it is in contact with the upper surface of the interlayer insulation film 207 and the side surfaces of the interlayer insulation film 209, and further in contact with the diffusion layer 205b and the gate electrode 204 by way of the contact 208.

The dielectric film 211 may be made of, for example, tantalum pentoxide ($Ta_2O_5$), and is formed on the interlayer insulation film 209 and the storage node 210. The cell plate 212 may be made of, for example, titanium nitride (TiN) and is formed on the dielectric film 211. Furthermore, the interlayer insulation film 213 may be made up of, for example, a silicon oxide film and is formed on the cell plate 212 such that the capacitor is buried under the interlayer insulation film 213.

The semiconductor device of the present embodiment further includes components such as: contacts formed in the interlayer insulation films 207, 209, and 213; wiring layers sequentially formed on the contacts; interlayer insulation film through-holes formed on the wiring layers; and other wiring layers. However, these components are omitted from FIGS. 2A and 2b.

Figure 3:
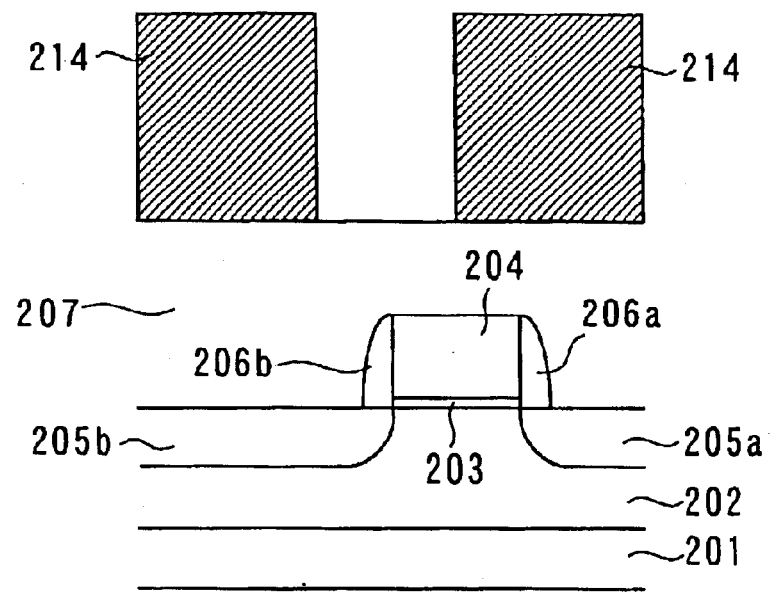
FIG. 3 shows a method for manufacturing a semiconductor device according to the first embodiment.

Description will be made below of a method for manufacturing the semiconductor device of the present embodiment with reference to FIGS. 3 to 5.

First of all, the P-well region 202 is formed on the P-type semiconductor substrate 201. Then, the gate insulation film 203 is formed in a predetermined area on the P-well region 202. After that, the gate electrode 204 is formed on the gate insulation film 203.

Subsequently, the N-type diffusion layers 205a and 205b, to be used as (or turned into) a source or a drain, are formed within the P-well region 202 on both side of the gate electrode 204. Then, an insulation film such as a silicon nitride film is deposited and then etched, leaving the gate insulation film 203 and sidewalls on the gate electrode 204. This process forms the gate insulation film 203 and the sidewalls 206a and 206b on the side surfaces of the gate electrode 204.

Then, the interlayer insulation film 207 is formed on the N-type diffusion layers 205a and 205b, the gate electrode 204, and the sidewalls 206a and 206b. After that, a resist film (not shown) is coated on the interlayer insulation film 207, and then a resist pattern 214 having a predetermined pattern is formed by use of a photolithographic technique, producing the structure shown in FIG. 3.

Figure 4:
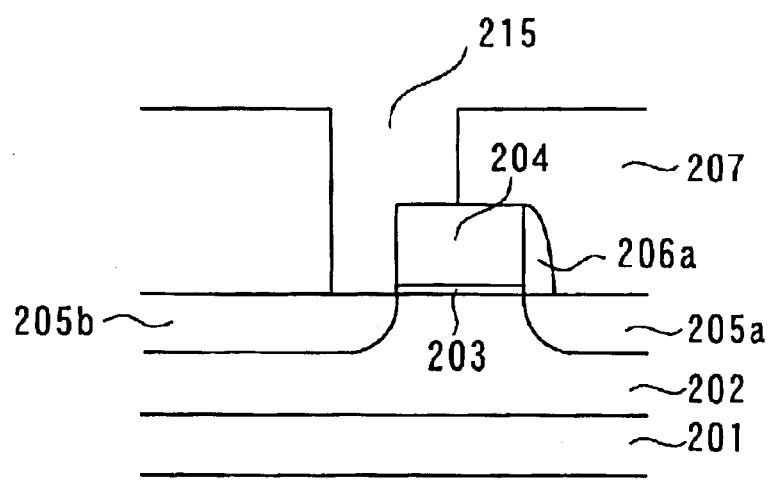
FIG. 4 shows a method for manufacturing a semiconductor device according to the first embodiment.

Then, after the interlayer insulation film 207 and the sidewall 206b are etched using the resist pattern 214 as a mask to form a contact hole 215, the resist pattern 214 is peeled off, producing the structure shown in FIG. 4.

Figure 5:
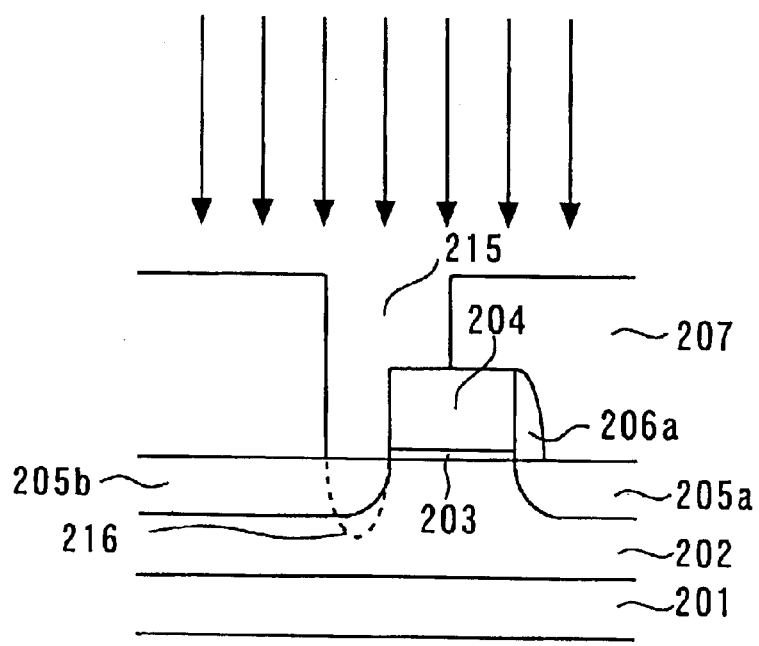
FIG. 5 shows a method for manufacturing a semiconductor device according to the first embodiment.

According to the present embodiment, after the contact hole 215 is formed, an N-type impurity such as phosphor (P) or arsenic (As) may be implanted in the P-well region 202 under the contact hole 215 to form an N-type diffusion region 216, as shown in FIG. 5. With this arrangement, it is possible to reduce the junction leakage current of the contact formed in the contact hole 215. It should be noted that the N-type diffusion region 216 may have any depth and any impurity concentration if it can serve such a purpose.

Then, a film of polysilicon doped with an N-type impurity is formed on the entire surface, and the chemical mechanical polishing (CMP) method or the etchback method is applied to the polysilicon to leave the polysilicon only in the contact hole 215, thereby forming a contact. After that, the capacitor having a cylindrical shape is formed on the interlayer insulation film 209 and the contact. Then, a known process necessary for manufacturing a semiconductor device can be carried out to produce a semiconductor device having the structure shown in FIG. 2A or 2B.

As shown in FIG. 1, the present embodiment is characterized in that the diffusion layer 101, the gate electrode 102, and the storage node 104 are connected to one another by way of the single common contact 103. Prior art techniques, on the other hand, require one storage node contact hole, two other contact holes, and a wire for connecting these contact holes to connect between the diffusion layer, the gate electrode, and the storage node and thereby set them at the same potential. According to the present embodiment, only a single contact hole is required to connect between the diffusion layer, the gate electrode, and the storage node and thereby set them at the same potential, making it possible to further reduce the cell area. It should be noted that the diffusion layer, the gate electrode, and the capacitor may be formed in a memory cell region on the semiconductor substrate, or they may be formed in a region other than memory cell regions.

Thus, whereas the prior art techniques must form a storage node contact hole and two other contact holes, the present embodiment only needs to form a single contact hole, making it possible to reduce the decrease in the yield due to the formation of insufficiently opened contacts in the semiconductor manufacturing process.

Further, according to the present embodiment, only a single contact needs to be employed. This eliminate the wires for connecting between contacts, which are required by the prior art techniques, making it possible to reduce the occurrence of defects such as wire shorts and breakages in the semiconductor manufacturing process and thereby increase the yield.

Still further, according to the present embodiment, the area of the portion of the contact in contact with the diffusion layer may be made larger than that in contact with the top surface of the gate electrode to reduce the contact resistance between the contact and the diffusion layer, making it possible to produce a high-performance device.

Still further, according to the present embodiment, a diffusion layer may be further formed within the P-well region under the contact to control the junction leakage current of the contact.

Second Embodiment

A plan view of a semiconductor device according to a second embodiment of the present invention is the same as that of the first embodiment shown in FIG. 1. That is, the diffusion layer, the gate electrode, and the storage node of the second embodiment are connected to one another by way of a common contact.

The present embodiment is characterized in that hole sidewalls are formed on the side surfaces of the contact, that is, between the contact and the interlayer insulation film and between the contact and a side surface of the gate electrode.

Figure 6:
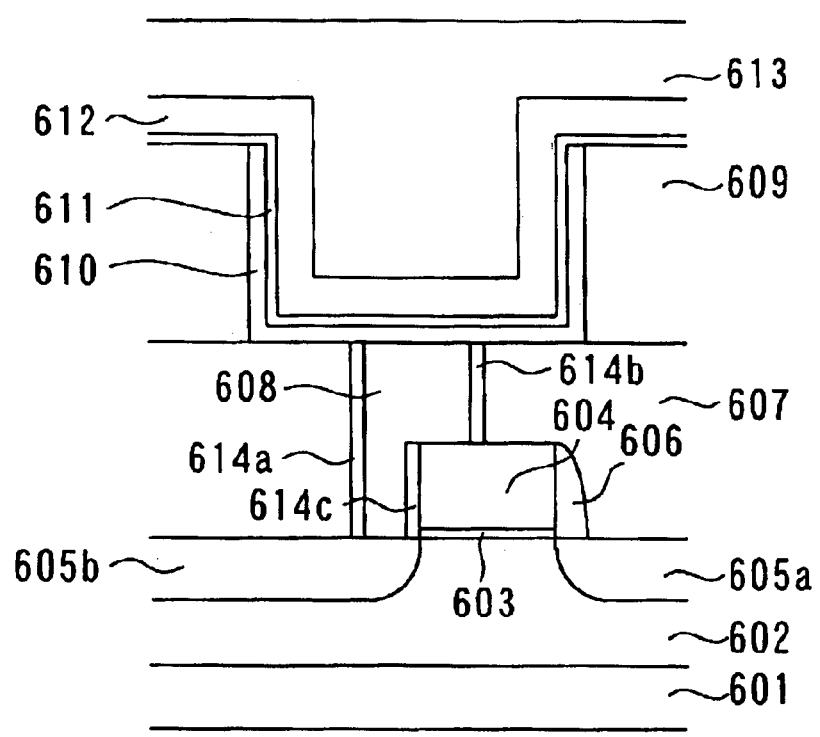
FIG. 6 shows a semiconductor device according to the second embodiment.

FIG. 6 is a cross-sectional view of the semiconductor device of the present embodiment. As shown in FIG. 6, the semiconductor device includes a P-well region 602, a gate insulation film 603, a gate electrode 604, N-type diffusion layers 605a and 605b, an interlayer insulation film 607, a contact 608, a gate sidewall 606, and hole sidewalls 614a, 614b, and 614c which are all formed above a P-type semiconductor substrate 601.

Referring to FIG. 6, the gate sidewall 606 is the same as the sidewall 206 of the first embodiment shown in FIG. 2. The hole sidewalls 614a, 614b, and 614c, on the other hand, are unique to the present embodiment.

The sidewalls 614a and 614b are formed between the interlayer insulation film 607 and the contact 608, while the sidewall 614c is formed between a side surface of the gate electrode 604 and the contact 608.

The sidewalls 614a, 614b, and 614c may be made up of, for example, a silicon nitride film, a silicon oxide film, or a silicon oxynitride film. Specifically, they can be formed by depositing a silicon nitride film in the contact hole by use of the chemical vapor deposition method, etc. and then anisotropically etching it.

Referring to FIG. 6, the present embodiment is preferably applied to the case where there is another gate electrode (not shown) to the left of the contact 608, and the distance between this gate electrode and the contact 608 is small. For example, assume that shorting between the hole for the contact 608 and the above gate electrode has occurred at the time of forming the contact 608 due to an increase in the amount of etching performed on the interlayer insulation film 607. Even in such a case, it is possible to prevent shorting between the contact 608 and the above gate electrode by forming the sidewall 614a.

Further, when the contact 608 is formed, the hole is lightly wet-etched by use of, for example, hydrogen fluoride (HF) before filling it with polysilicon doped with an N-type impurity. According to the present embodiment, since sidewalls 614a and 614b are formed on the inside walls of the hole (on the side surfaces of the interlayer insulation film 607), it is possible to prevent the size of the hole from exceeding a predetermined value due to the above wet etching.

Still further, the sidewall 614c is formed such that it covers the side surfaces of the gate insulation film 603 and the gate electrode 604 on the side on which the gate electrode 604 is in contact with the contact 608. Forming the sidewall 614c in this manner makes it possible to electrically separate the P-well region 602 from the contact 608, reducing the occurrence of current leakage.

According to the present embodiment, the capacitor is made up of: a storage node 610 constituting the lower electrode; a dielectric film 611; and a cell plate 212 constituting the upper electrode. The capacitor is formed on the interlayer insulation film 607. An interlayer insulation film 609 is formed on both sides of the capacitor, while an interlayer insulation film 613 is formed over the capacitor. This arrangement is the same as that of the first embodiment.

As shown in FIG. 6, in the present embodiment, the bottom of the contact 608 is connected with the upper surfaces of the N-type diffusion layer 605 and the gate electrode 604, while the top of the contact 608 is connected with the storage node 610.

The semiconductor device of the present embodiment further includes components such as: contacts formed in the interlayer insulation films 607, 609, and 613; and wiring layers, wires, interlayer insulation films, and through holes which are sequentially formed on the tops of the contacts. However, these components are omitted from FIG. 6.

According to the present embodiment, sidewalls are provided between the interlayer insulation film and the contact. Therefore, even when shorting between the hole for the contact and a neighboring gate electrode has occurred at the time of the formation of the contact due to an increase in the amount of etching performed on the interlayer insulation film, it is possible to prevent shorting between the contact itself and the (neighboring) gate electrode.

Further, according to the present embodiment, since sidewalls are provided between the interlayer insulation film and the contact, it is possible to prevent the size of the hole from exceeding a predetermined value due to wet etching.

Still further, according to the present embodiment, since sidewalls are formed on both sides of the gate insulation film and the gate electrode, it is possible to electrically separate the P-well region from the contact, reducing the occurrence of current leakage.

Still further, according to the present embodiment, a common contact can be used to connect between the diffusion layer, the gate electrode, and the storage node and thereby set them at the same potential, making it possible to reduce the cell area.

Still further, whereas the prior art techniques must form a storage node contact hole and two other contact holes, the present embodiment only needs to form a single contact hole, making it possible to reduce the decrease in the yield due to the formation of insufficiently opened contacts in the semiconductor manufacturing process.

Still further, according to the present embodiment, only a single contact needs to be employed. This eliminate the wires for connecting contacts, which are required by the prior art techniques, making it possible to reduce the occurrence of defects such as wire shorts and breakages in the semiconductor manufacturing process and thereby increase the yield.

Third Embodiment

A plan view of a semiconductor device according to a third embodiment of the present invention is the same as that of the first embodiment shown in FIG. 1. That is, the diffusion layer, the gate electrode, and the storage node of the third embodiment are connected to one another by way of a common contact.

Figure 7:
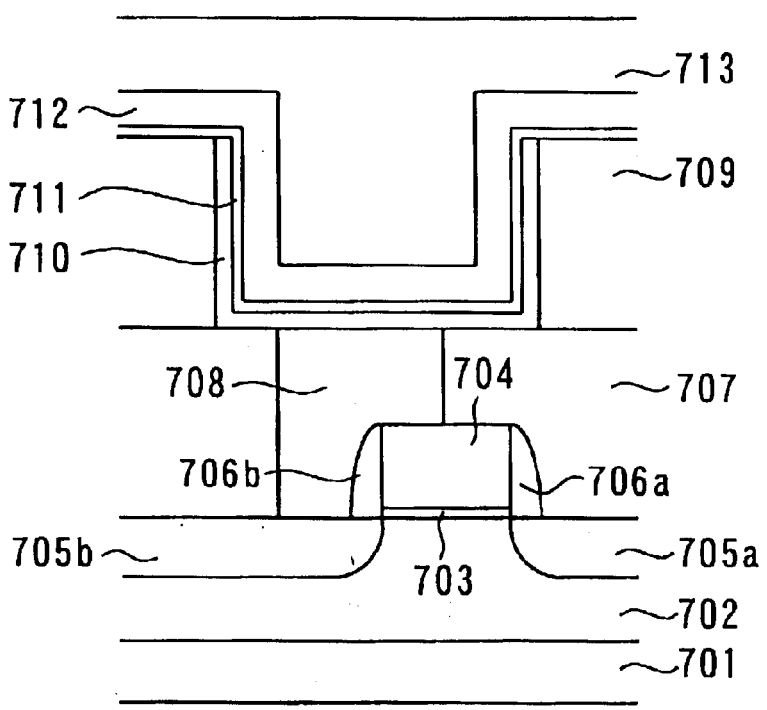
FIG. 7 shows a semiconductor device according to the third embodiment.

FIG. 7 is a cross-sectional view of the semiconductor device of the present embodiment. The present embodiment is characterized in that sidewalls are left on both sides of the gate insulation film and the gate electrode.

As shown in FIG. 7, the semiconductor device includes a P well region 702, a gate insulation film 703, a gate electrode 704, N-type diffusion layers 705a and 705b, sidewalls 706a and 706b, an interlayer insulation film 707, and a contact 708 which are all formed above a P-type semiconductor substrate 701.

In the first embodiment, even though two sidewalls are formed, only the sidewall on the side on which the gate electrode is in contact with the interlayer insulation film is left (not removed). The other sidewall (on the side on which the gate electrode is in contact with the contact) is removed at the time of etching the hole. The present embodiment, on the other hand, is characterized in that the sidewall formed on the gate electrode and the gate insulation film on the side on which the gate electrode is in contact with the contact is also not removed.

Referring to FIG. 7, the sidewall 706a is the same as the sidewall 206 of the first embodiment shown in FIG. 2. The sidewall 706b, on the other hand, is unique to the present embodiment, and formed on the side on which the gate electrode 704 is in contact with the contact 708 such that the sidewall 706b covers the side surfaces of the gate insulation film 703 and the gate electrode 704. Forming the sidewall 706b makes it possible to electrically separate the P-well region 702 from the contact 708, reducing the occurrence of current leakage.

For example, after sequentially forming the P-well region 702, the gate insulation film 703, the gate electrode 704, and the N-type diffusion layers 705a and 705b on the P-type semiconductor substrate 701, the sidewalls 706a and 706b are formed such that they cover the side surfaces of the gate insulation film 703 and the gate electrode 704.

After the formation of the sidewalls 706a and 706b, the interlayer insulation film 707 is formed on the N-type diffusion layers 705a and 705b, the gate electrode 704, and the sidewalls 706a and 706b. Then, a predetermined region of the interlayer insulation film 707 is etched to form the contact 708. At that time, if the etching conditions are set such that the sidewall 706b is also etched, a structure in which the sidewall 706b has been removed will be obtained. The first embodiment is an example in which the sidewall 706b is etched in this manner, together with the interlayer insulation film 707.

According to the present embodiment, the etching conditions are set such that the interlayer insulation film 707 is selectively etched without etching the sidewall 706b when forming the contact 708. For example, when sidewalls made up of a silicon nitride film have been formed, the interlayer insulation film is etched under conditions which give selectivity against the silicon nitride film.

As shown in FIG. 7, the bottom of the contact 708 thus formed is connected with the upper surfaces of the N-type diffusion layer 705b and the gate electrode 704, while the top of the contact 708 is connected with the storage node 710 constituting the capacitor lower electrode. The storage node 710 is made of, for example, polysilicon doped with an N-type impurity whose surface is roughened, and has a cylindrical shape.

Further, as shown in FIG. 7, the semiconductor device of the present embodiment further includes an interlayer insulation film 709, a dielectric film 711, a cell plate 712, and an interlayer insulation film 713. These-components are the same as those for the first embodiment.

The semiconductor device of the present embodiment still further includes components such as: contacts formed in the interlayer insulation films 707, 709, and 713; and wiring layers, wires, interlayer insulation films, and through holes which are sequentially formed on the tops of the contacts. However, these components are omitted from FIG. 7.

According to the present embodiment, since sidewalls are formed on both sides of the gate insulation film and the gate electrode, it is possible to fully electrically separate the P-well region from the contact, reducing the occurrence of current leakage.

Further, according to the present embodiment, a common contact can be used to connect between the diffusion layer, the gate electrode, and the storage node and thereby set them at the same potential, making it possible to reduce the cell area.

Still further, whereas the prior art techniques must form a storage node contact hole and two other contact holes, the present embodiment only needs to form a single contact hole, making it possible to reduce the decrease in the yield due to the formation of insufficiently opened contacts in the semiconductor manufacturing process.

Still further, according to the present embodiment, only a single contact needs to be employed. This eliminates the wires for connecting contacts, which are required by the prior art techniques, making it possible to reduce the occurrence of defects such as wire shorts and breakages in the semiconductor manufacturing process and thereby increase the yield.

Fourth Embodiment

A plan view of a semiconductor device according to a fourth embodiment of the present invention is the same as that of the first embodiment shown in FIG. 1. That is, the diffusion layer, the gate electrode, and the storage node of the fourth embodiment are connected to one another by way of a common contact.

The present embodiment is characterized in that the upper surfaces of the diffusion layer and the gate electrode are silicified.

Figure 8:
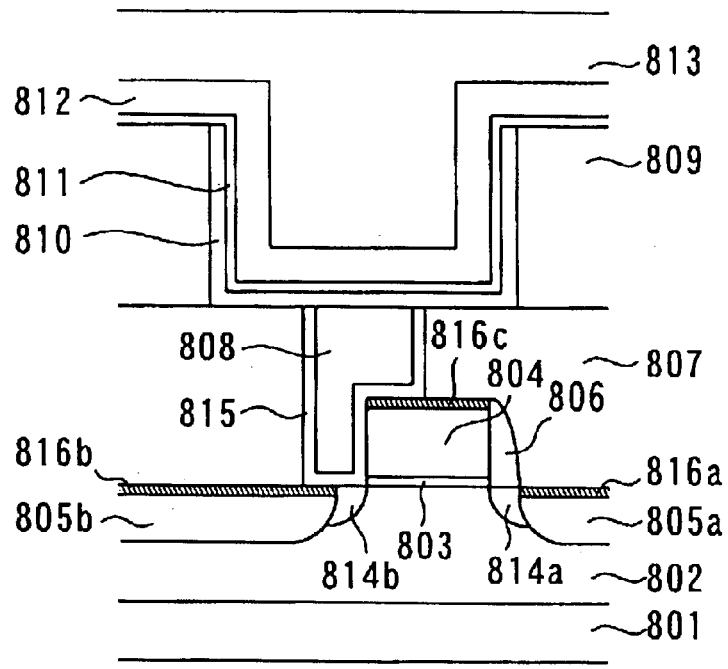
FIG. 8 shows a semiconductor device according to the fourth embodiment.

FIG. 8 is a cross-sectional view of the semiconductor device of the present embodiment. As shown in FIG. 8, in the semiconductor device of the present embodiment, a cobalt silicide ($CoSi_2$) film is formed on the diffusion layers and the gate electrode, and the capacitor on the cobalt silicide film has an MIM (Metal Insulator Metal) structure.

As shown in FIG. 8, the semiconductor device includes a P-well region 802, a gate insulation film 803, a gate electrode 804, a sidewall 806, an interlayer insulation film 807, and a contact 808 which are all formed above a P-type semiconductor substrate 801.

The P-well region 802 has formed therein $N^-$-type diffusion layers 814a and 814b, to be used as (or turned into) a source or drain region, and $N^+$-type diffusion layers 805a and 805b. The $N^-$-type diffusion layers 814a and 814b are shallow and thin diffusion layers and formed on both sides of the gate electrode 804. The $N^+$-type diffusion layers 805a and 805b, on the other hand, are deep and thick diffusion layers and formed on both sides of the gate electrode 804 with the gate electrode 804 and the sidewalls (the $N^-$-type diffusion layers 814a and 814b) therebetween.

The present embodiment is characterized in that the upper surfaces (portions) of the $N^+$-type diffusion layers 805a, 805b, and 805c and the gate electrode 804 are silicified and thereby cobalt silicide layers 816a and 816b are formed. It should be noted that the present embodiment is not limited to a particular type of silicide layer such as a cobalt silicide layer. Another metal silicide layer may be employed.

The gate electrode 804 may be made of, for example, polysilicon doped with an N-type impurity. It should be noted that the portion of the gate electrode 804 shown in FIG. 8 functions as only a wire and is not used for any transistor operation.

The sidewall 806 is formed on side surfaces of the gate insulation film 803 and the gate electrode 804 and made up of, for example, a silicon oxide film, a silicon nitride film, or silicon oxynitride film. It should be noted that according to the present embodiment, no sidewall is formed on the side on which the gate electrode 804 is in contact with the contact 808.

The interlayer insulation film 807 is made up of, for example, a silicon oxide film, a silicon nitride film, or a silicon oxynitride film. As shown in FIG. 8, the contact 808 is formed in the interlayer insulation film 807. According to the present embodiment, the contact 808 is made of, for example, tungsten (W). Barrier metal 815 of titanium nitride (TiN) is formed on the surfaces of the contact 808 which are in contact with the $N^-$-type diffusion layers 805a or 805b, the interlayer insulation film 807, and the gate electrode 804.

Referring to FIG. 8, the top of the contact 808 is connected with a storage node 810 constituting the capacitor lower electrode. The storage node 810 is made of, for example, ruthenium (Ru) or titanium nitride (TiN).

According to the present embodiment, the capacitor is made up of the storage node 810, a dielectric film 811, and a cell plate 812. The capacitor is formed in the interlayer insulation film 809 (such that it divides the interlayer insulation film 809). The interlayer insulation film 813 is formed over the capacitor.

The interlayer insulation film 809 may be made up of, for example, a silicon oxide film, a silicon nitride film, or a silicon oxynitride film and formed on the interlayer insulation film 807. The storage node 810 is formed on side surfaces of the interlayer insulation film 809. The dielectric film 811 may be made of, for example, tantalum pentoxide ($Ta_2O_5$) and formed on the interlayer insulation film 809 and the storage node 810. The cell plate 812, on the other hand, is the upper electrode of the capacitor formed on the dielectric film 811 and may be made of, for example, ruthenium or titanium nitride. Furthermore, the interlayer insulation film 813 may be made up of, for example, a silicon oxide film and formed on the cell plate 812.

The semiconductor device of the present embodiment further includes components such as: contacts formed in the interlayer insulation films 807, 809, and 813; and wiring layers, wires, interlayer insulation films, and through holes which are sequentially formed on the tops of the contacts. However, these components are omitted from FIG. 8.

Description will be made below of a method for manufacturing the semiconductor device of the present embodiment with reference to FIG. 8.

First of all, the P well region 802 is formed on the P type semiconductor substrate 801. Then, the gate insulation film 803 is formed in a predetermined area on the P well region 802. After that, the gate electrode 804 is formed on the gate insulation film 803.

Subsequently, the $N^-$-type diffusion layers 814a and 814b, to be used as (or turned into) a source or a drain, are formed within the P-well region 802 on both sides of the gate electrode 804. Then, an insulation film such as a silicon nitride film is deposited and then etched, leaving sidewalls on the gate insulation film 803 and the gate electrode 804. This process forms the sidewalls 806 on the side surfaces of the gate insulation film 803 and the gate electrode 804. It should be noted that at this time point, sidewalls are formed on both sides of the gate insulation film and the gate electrode, which is different from what is shown in FIG. 8.

Then, the $N^+$-type diffusion layers 805a and 805b, to be used as (or turned into) a source or a drain, are formed within the P-well region 802 outside the sidewalls. After that, cobalt silicide layers 816a, 816b, and 816c are formed on the $N^+$-type diffusion layers 805a and 805b and the gate electrode 804, respectively.

Then, an insulation film (the interlayer insulation film 807) is deposited on the $N^+$-type diffusion layers 805a and 805b such that it coats the gate electrode 804 and the sidewalls 806. After that, the interlayer insulation film 807 and the sidewalls 806 are etched to produce the contact hole. This etching removes the sidewall in contact with the contact, leaving only the sidewall in contact with the interlayer insulation film, as shown in FIG. 8.

According to the present embodiment, after the contact hole is formed, an N-type impurity such as phosphor (P) or arsenic (As) may be implanted in the P-well region 802 under the contact hole to further form an N-type diffusion region. With this arrangement, it is possible to reduce the junction leakage current of the contact. It should be noted that the N-type diffusion region may have any depth and any impurity concentration if it can serve such a purpose.

Then, after forming the contact hole barrier metal 815, the contact hole is filled with tungsten to form the contact 808. After that, the capacitor having a cylindrical shape is formed on the interlayer insulation film 809 and the contact. Then, a known process necessary for manufacturing a semiconductor device can be carried out to produce a semiconductor device having the structure shown in FIG. 8.

According to the present embodiment, since the data storage portion is metalized, the contact resistance and the sheet resistance can be reduced, making it possible to operate the cell portion at high speed.

Further, according to the present embodiment, a common contact can be used to connect between the diffusion layer, the gate electrode, and the storage node and thereby set them at the same potential, making it possible to reduce the cell area.

Still further, whereas the prior art techniques must form a storage node contact hole and two other contact holes, the present embodiment only needs to form a single contact hole, making it possible to reduce the decrease in the yield due to the formation of insufficiently opened contacts in the semiconductor manufacturing process.

Still further, according to the present embodiment, only a single contact needs to be employed. This eliminates the wires for connecting contacts, which are required by the prior art techniques, making it possible to reduce the occurrence of defects such as wire shorts and breakages in the semiconductor manufacturing process and thereby increase the yield.

Fifth Embodiment

A plan view of a semiconductor device according to a fifth embodiment of the present invention is the same as that of the first embodiment shown in FIG. 1. That is, the diffusion layer, the gate electrode, and the storage node of the fifth embodiment are connected to one another by way of a common contact.

The present embodiment is a combination of the third embodiment and the fourth embodiment. That is, the present embodiment is characterized in that sidewalls are formed on both sides of the gate electrode and the gate insulation film, and furthermore the upper surfaces of the diffusion layers and the gate electrode are silicified.

Figure 9:
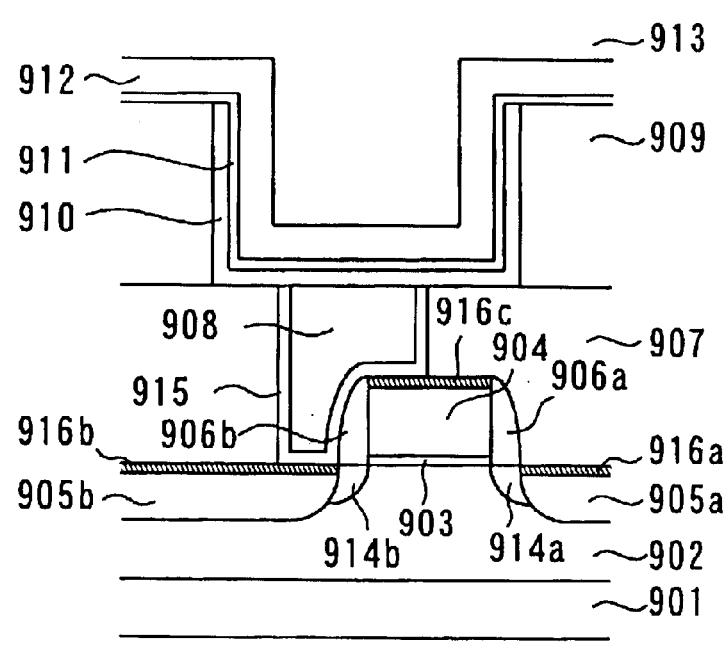
FIG. 9 shows a semiconductor device according to the fifth embodiment.

FIG. 9 is a cross-sectional view of the semiconductor device of the present embodiment. As shown in FIG. 9, the semiconductor device includes a P-well region 902, a gate insulation film 903, a gate electrode 904, sidewalls 906a and 906b, an interlayer insulation film 907, and a contact 908 which are all formed above a P-type semiconductor substrate 901.

The P-well region 902 has formed therein N$^-$-type diffusion layers 914a and 914b, to be used as (or turned into) a source or drain region, and N$^+$-type diffusion layers 905a and 905b. The N$^-$-type diffusion layers 914a and 914b are shallow diffusion layers and formed on both sides of the gate electrode 904. The N$^+$-type diffusion layers 905a and 905b, on the other hand, are deep diffusion layers and formed on both sides of the gate electrode 904 outside the sidewalls 906a and 906b.

The gate electrode 904 may be made of, for example, polysilicon doped with an N-type impurity. It should be noted that the portion of the gate electrode 904 shown in FIG. 9 functions as only a wire and is not used for any transistor operation.

The present embodiment is characterized in that the upper surfaces of the N$^+$-type diffusion layers 905a and 905b and the gate electrode 904 are silicified and thereby cobalt silicide layers 916a and 916b are formed. It should be noted that the present embodiment is not limited to a particular type of silicide layer such as a cobalt silicide layer. Another metal silicide layer may be employed.

The present embodiment is also characterized in that the sidewalls 906a and 906b are formed on both sides of the gate electrode 904. With this arrangement, it is possible to electrically separate the P-well region 902 from the contact 908, reducing the occurrence of current leakage. The sidewalls are made up of, for example, a silicon oxide film, a silicon nitride film, or a silicon oxynitride film.

The interlayer insulation film 907 is made up of, for example, a silicon oxide film, a silicon nitride film, or a silicon oxynitride film. As shown in FIG. 9, the contact 908 is formed in the interlayer insulation film 907. According to the present embodiment, the contact 908 is made of, for example, tungsten (W). Barrier metal 915 of titanium nitride (TiN) is formed on the surfaces of the contact 908 which are in contact with the N$^-$-type diffusion layers 905a or 905b, the interlayer insulation film 907, and the gate electrode 904.

Referring to FIG. 9, the top of the contact 908 is connected with a storage node 910 constituting the capacitor lower electrode. The storage node 910 is made of, for example, ruthenium (Ru) or titanium nitride (TiN).

According to the present embodiment, the capacitor is made up of the storage node 910, a dielectric film 911, and a cell plate 912. The capacitor is formed in the interlayer insulation film 909 (such that it divides the interlayer insulation film 909). An interlayer insulation film 913 is formed over the capacitor.

The interlayer insulation film 909 may be made up of, for example, a silicon oxide film, a silicon nitride film, or a silicon oxynitride film and formed on the interlayer insulation film 907. The storage node 910 is formed on side surfaces of the interlayer insulation film 909. The dielectric film 911 may be made of, for example, tantalum pentoxide (Ta$_2$O$_5$) and formed on the interlayer insulation film 909 and the storage node 910. The cell plate 912, on the other hand, is the upper electrode of the capacitor formed on the dielectric film 911 and may be made of, for example, ruthenium or titanium nitride. Furthermore, the interlayer insulation film 913 may be made up of, for example, a silicon oxide film and formed on the cell plate 912.

The semiconductor device of the present embodiment further includes components such as: contacts formed in the interlayer insulation films 907, 909, and 913; and wiring layers, wires. interlayer insulation films, and through holes which are sequentially formed on the tops of the contacts. However, these components are omitted from FIG. 9.

According to the present embodiment, since data storage portion is metalized, the contact resistance and the sheet resistance can be reduced, making it possible to operate the cell portion at high speed.

Further according to the present embodiment, since sidewalls are formed on both sides of the gate insulation film and the gate electrode, it is possible to electrically separate the P-well region from the contact and thereby reduce the occurrence of current leakage.

Still further, according to the present embodiment, a common contact can be used to connect between the diffusion layer, the gate electrode, and the storage node and thereby set them at the same potential, making it possible to reduce the cell area.

Still further, whereas the prior art techniques must form a storage node contact hole and two other contact holes, the present embodiment only needs to form a single contact hole, making it possible to reduce the decrease in the yield due to the formation of insufficiently opened contacts in the semiconductor manufacturing process.

Still further, according to the present embodiment, only a single contact needs to be employed. This eliminates the wires for connecting contacts, which are required by the prior art techniques, making it possible to reduce the occurrence of defects such as wire shorts and breakages in the semiconductor manufacturing process and thereby increase the yield.

Sixth Embodiment

A sixth embodiment of the present invention will be described with reference to FIGS. 10 to 14.

The present embodiment is characterized in that diffusion layers, gate electrodes, and capacitors are formed in a memory cell region made up of T-CAM cells on a semiconductor substrate.

Figure 10:
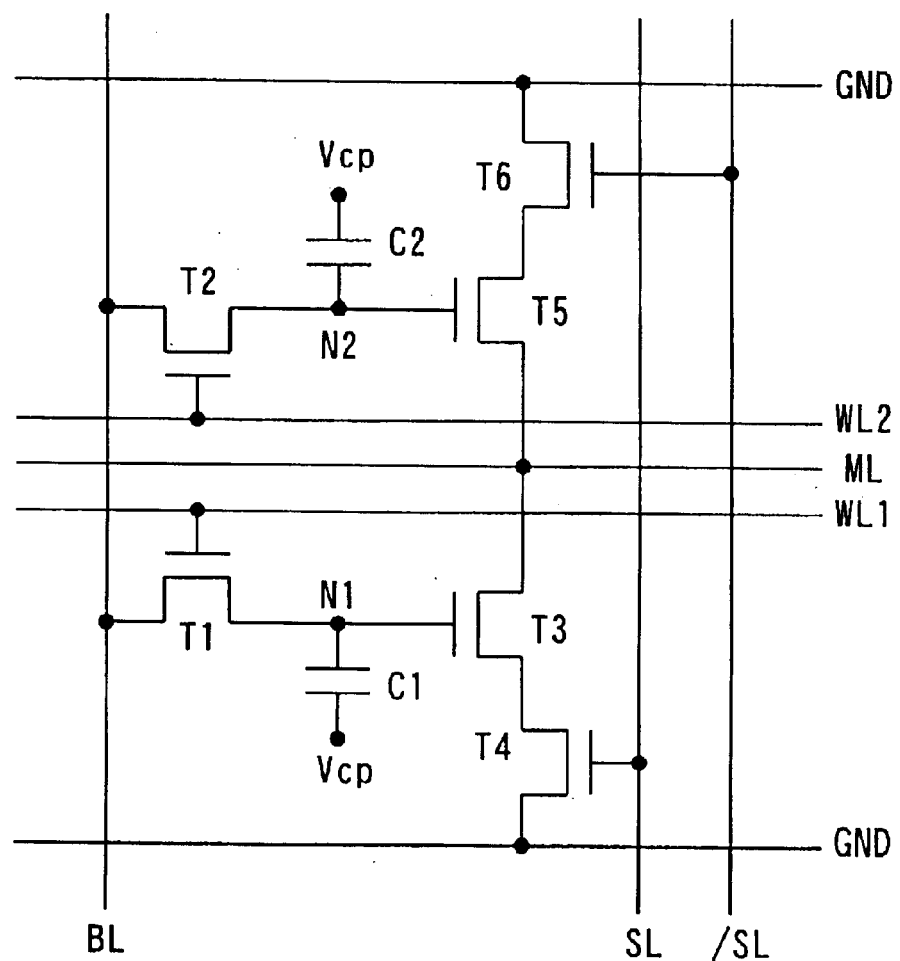
FIG. 10 shows a circuit diagram of T-CAM cell according to the sixth embodiment.
Figure 11:
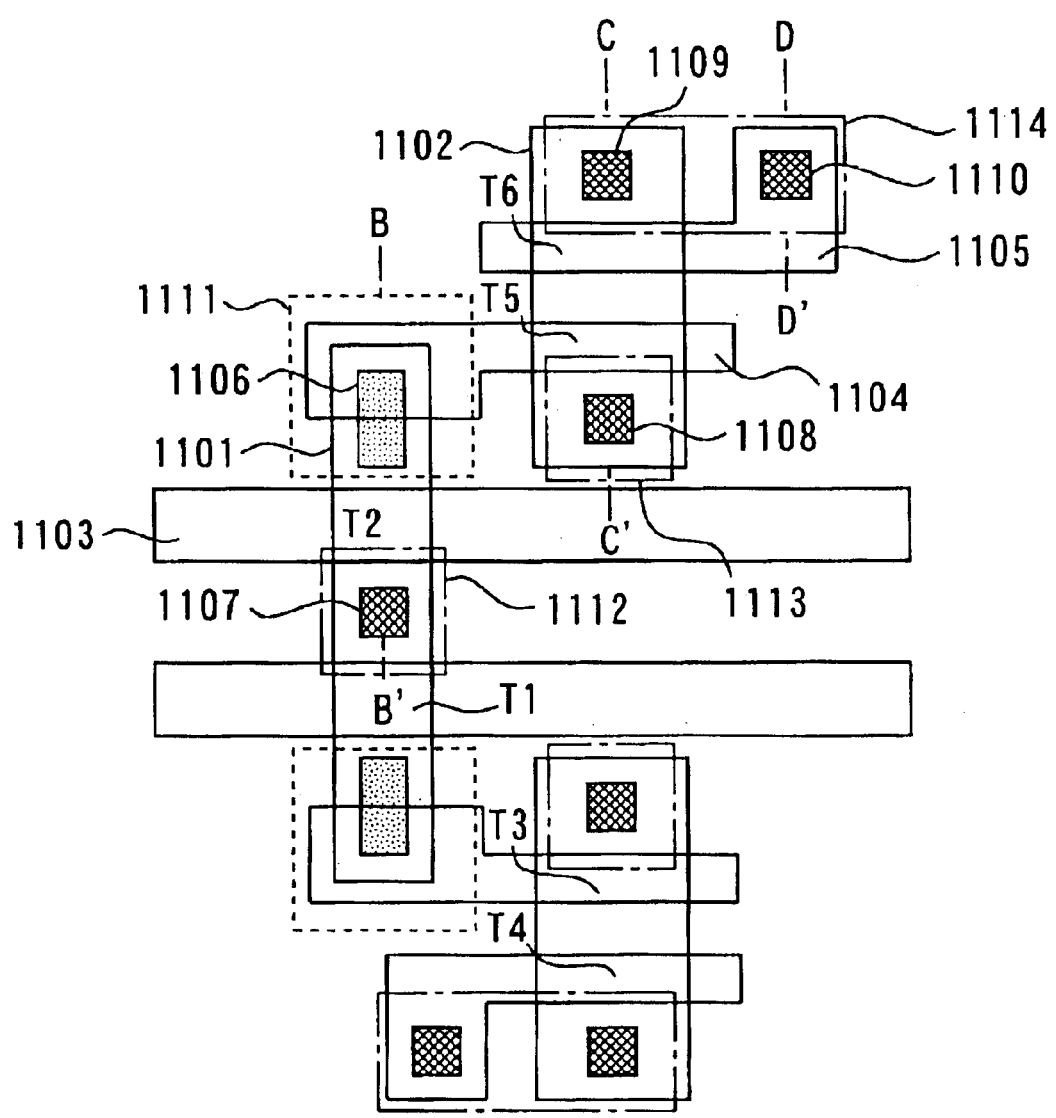
FIG. 11 shows a semiconductor device according to the sixth embodiment.

FIG. 10 is a circuit diagram of a single T-CAM cell, and FIG. 11 is its layout diagram.

As shown in FIG. 10, a memory cell transistor $T_1$ in the DRAM portion is connected to a word line $WL_1$ and a bit line BL, while a memory cell transistor $T_2$ is connected to a word line $WL_2$ and the bit line BL.

Capacitors $C_1$ and $C_2$ are connected to storage nodes $N_1$ and $N_2$, respectively. They are also connected to a cell plate potential $V_{cp}$, which acts as the opposite electrode.

A search transistor $T_3$ is connected to the storage node $N_1$ such that its gate electrode is held at the same potential as that of the storage node $N_1$. A search transistor $T_5$, on the other hand, is connected to the storage node $N_2$ such that its gate electrode is held at the same potential as that of the storage node $N_2$.

A search line SL is connected to the gate electrode of a search transistor $T_4$, while a complementary search line "/SL" is connected to the gate electrode of a search transistor $T_6$.

The search transistors $T_3$ and $T_4$ are connected in series. The search transistor $T_3$ is connected to a match line ML, while the search transistor $T_4$ is connected to ground potential GND. Likewise, the search transistors $T_5$ and $T_6$ are also connected in series. The search transistor $T_5$ is connected to the match line ML, while the search transistor $T_6$ is connected to ground potential GND.

The match line ML is precharged before a search is executed. The search is initiated by setting the search line SL and the complementary search line "/SL" to High and Low, respectively, or Low and High. The storage nodes $N_1$ and $N_2$ respectively store either High and Low, Low and High, or Low and Low. When the levels stored in the storage nodes are in such a combination that the search transistors $T_3$ and $T_4$ are both turned on or the search transistors $T_5$ and $T_6$ are both turned on, the potential of the match line ML is brought to ground potential GND. When the levels are in a combination other than the above combination, the match line ML remains precharged. In reality, a plurality of T-CAM cells are connected to a single match line such that a search target is found when none of the T-CAM cells have brought the match line to ground potential GND.

In FIG. 11, reference numeral 1101 denotes the layout of the diffusion layer for memory cell transistors $T_2$ and $T_1$ in the DRAM, while 1102 denotes the layout of the diffusion layer for the search transistors $T_5$ and $T_6$. Reference numeral 1103 denotes the layout of the word line connected to the memory cell transistor $T_2$. Reference numeral 1104 denotes both the layout of the gate electrode of the search transistor $T_5$ and the layout of the gate wire connected to the storage node $N_2$ for the memory cell transistor $T_2$. Reference numeral 1105 denotes the layout of the gate electrode of the search transistor $T_6$.

Reference numeral 1106 denotes a portion of the storage node $N_2$, indicating the layout of the contact connecting between the diffusion layer, the gate electrode, and the storage node. Furthermore, reference numerals 1107, 1108, 1109, and 1110 denote the layouts of the contacts connected to the bit line, GND, the match line, and the search line, respectively. Reference numeral 1111 denotes the layout of the storage node, and reference numerals 1112, 1113, and 1114 denote the layouts of the cutout portions of the cell plate (that is, the area excluding these cutout portions constitutes the cell plate).

It should be noted that the memory cell transistor $T_1$ and the search transistors $T_3$ and $T_4$ are configured in the same way as the memory cell transistor $T_2$. Therefore, no further description will be provided.

Figure 12:
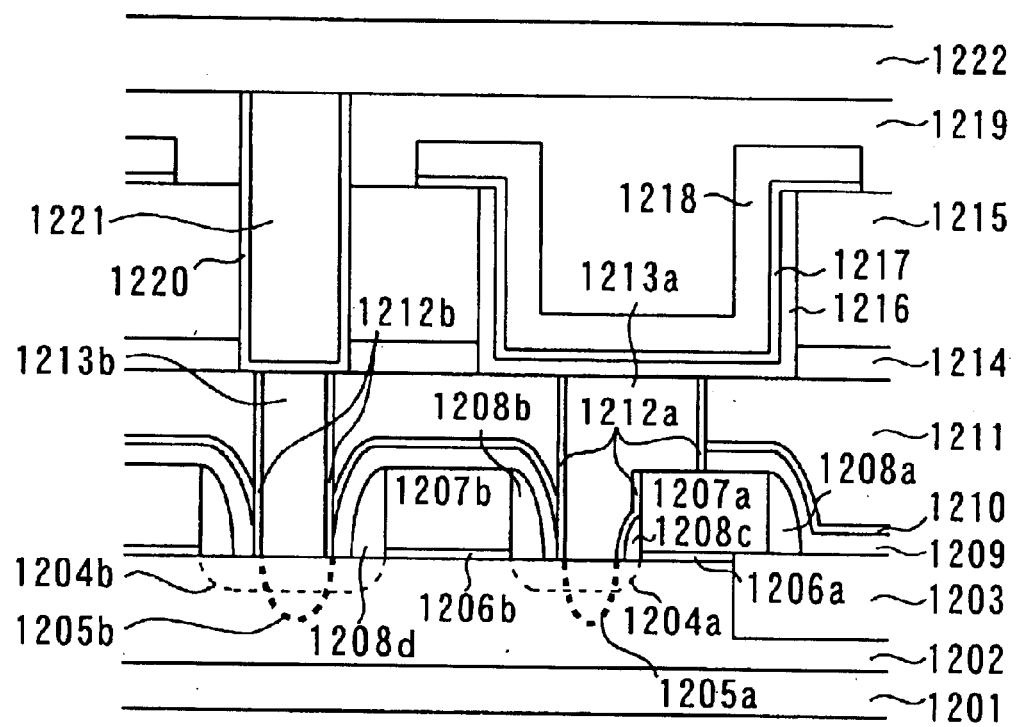
FIG. 12 shows a semiconductor device according to the sixth embodiment.

FIG. 12 is a cross-sectional view of the T-CAM cell in FIG. 11 taken along line B–B', indicating a portion of the DRAM which includes memory cell transistors and a capacitor.

As shown in FIG. 12, the semiconductor device of the present embodiment includes a P-well region 1202, a separation insulation film 1203, an $N^-$-type diffusion layers 1204a and 1204b, N-type diffusion layers 1205a and 1205b, gate insulation films 1206a and 1206b, gate electrodes 1207a and 1207b, sidewalls 1208a, 1208b, 1208c, and 1208d, an interlayer insulation film 1211, and contacts 1213a and 1213b which are all formed above a P-type semiconductor substrate 1201.

The N-type diffusion layers 1205a and 1205b are formed as a result of implanting an N-type impurity after etching the contact holes at the time of the formation of the contacts 1213a and 1213b.

In FIG. 12, the gate electrode 1207a corresponds to a gate wiring portion for transmitting data stored in the storage node to a search transistor. The gate electrode 1207b, on the other hand, is the gate electrode of a DRAM memory cell transistor. The gate electrodes 1207a and 1207b are made of, for example, polysilicon doped with an N-type impurity.

The sidewalls 1208a to 1208d are made up of a silicon oxide film, a silicon nitride film, etc. In the example shown in FIG. 12, the sidewall 1208c is smaller than the other sidewalls 1208a, 1208b, and 1208d, which is a result of etching at the time of the formation of the contact 1213a. Thus, according to the present embodiment, the sidewall 1208c can be of any size. The sidewall 1208c may have the same size as that of the other sidewalls 1208a, 1208b, and 1208d. Or the sidewall 1208c may be removed completely through etching.

A silicide protection film 1209 is formed on the portion including the gate electrodes 1207a and 1207b and sidewalls 1208a, 1208b, and 1208d and excluding the contacts 1213a and 1213b.

Generally, in the logic portion of a T-CAM chip, the upper surfaces (portions) of the diffusion layers and the gate electrodes are silicified to achieve high performance. In the case of the memory cell portion shown in FIG. 12, however, it is required that the memory cell portion be subjected to no silicification considering the refresh characteristics. The silicide protection film is a protective film provided to prevent the silicification of the memory cell portion.

A silicon nitride film 1210 for the self-aligned contacts of the logic portion is formed on the silicide protection film 1209. Furthermore, an interlayer insulation film 1211 made up of a silicon oxide film is formed on the silicon nitride film 1210. Contacts 1213a and 1213b made of polysilicon doped with an N-type impurity are formed in the interlayer insulation film 1211, the silicon nitride film 1210, and the silicide protection film 1209. The sidewalls 1212a and 1212b are formed between the interlayer insulation film 1211 and the contacts 1213a and 1213b.

Further, an etching stop film 1214 made up of a silicon nitride film is formed in a predetermined area on the interlayer insulation film 1211, and an interlayer insulation film 1215 made up of a silicon oxide film is formed on the etching stop film 1214. The etching stop film 1214 is provided to stop etching of the silicon oxide film at the time of forming the storage node or upper contacts.

A storage node 1216 of polysilicon doped with an N-type impurity whose upper surface is roughened is formed in predetermined areas on the contact 1213a and the interlayer insulation film 1211. A dielectric film 1217 of $Ta_2O_5$ is formed in predetermined areas on the storage node 1216 and the interlayer insulation film 1215. A cell plate 1218 is formed on the dielectric film 1217.

An interlayer insulation film 1219 is formed over the cell plate 1218 and the interlayer insulation film 1215.

Further, an upper contact 1221 of tungsten (W) is formed in the interlayer insulation film 1215 and the interlayer insulation film 1219. The present embodiment is characterized in that it has a stacked contact structure in which the upper contact 1221 is disposed on the top of the contact 1213b. Furthermore, barrier metal 1220 is formed on the inside walls of the upper contact 1221. The upper contact 1221 is directly connected with diffusion layers and gate electrodes in peripheral logic portions.

A first wire (metal wire) 1222 of aluminum (Al) or copper (Cu) is formed on the interlayer insulation film 1219 and the upper contact 1221.

Figure 13:
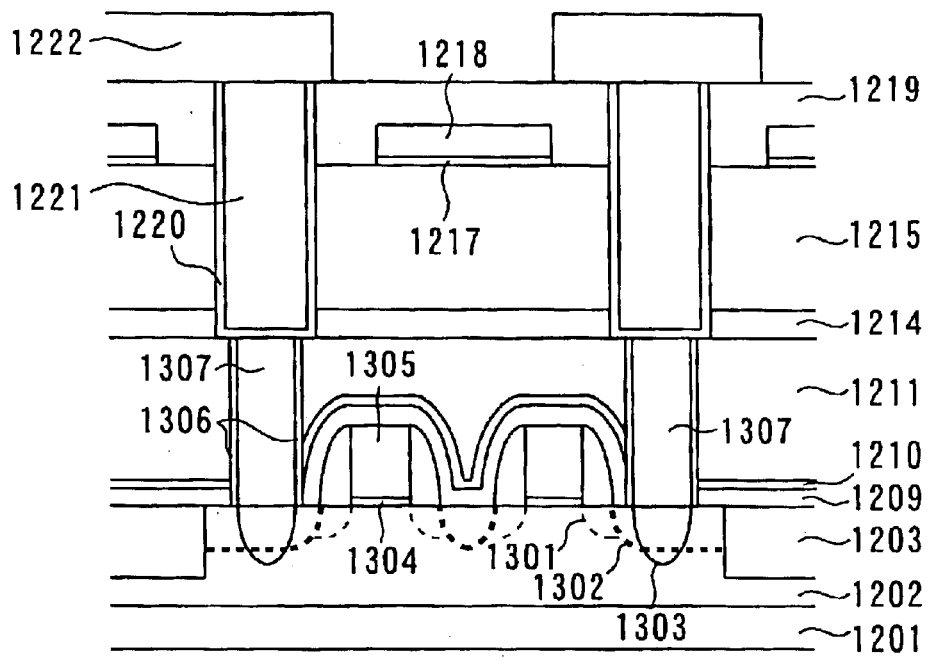
FIG. 13 shows a semiconductor device according to the sixth embodiment.

FIG. 13 is a cross-sectional view of the T-CAM cell in FIG. 1 taken along line C–C', indicating search transistors connected in series. It should be noted that the components in FIG. 13 which are the same as those in FIG. 12 are denoted by like numerals.

The P-well region 1202 formed on the P-type semiconductor substrate 1201 has formed therein an $N^-$-type diffusion layer 1301, an $N^+$-type diffusion layer 1302, and an N-type diffusion layer 1303. The $N^+$-type diffusion layer is formed in addition to the $N^-$-type diffusion layer, since each search transistor portion must have transistor driving capability and there is little concern over the leakage. The N-type diffusion layer 1303 is disposed under a contact 1307 and formed as a result of implanting an N-type impurity in the P-well region 1202 at the time of forming the contact hole.

The gate insulation films 1304 of the search transistors are formed in predetermined areas on the P-well region 1202. The gate electrodes 1305 are formed on the gate insulation films 1304. The gate electrodes 1305 are made of polysilicon doped with an N-type impurity.

Further, the separation insulation film 1203 is also formed in the P-well region 1202. The silicide protection film 1209, the nitride film 1210, and the interlayer insulation film 1211 are sequentially formed in predetermined areas on the separation insulation film 1203 and the P-well region 1202. A contact 1307 is formed in the silicide protection film 1209, the nitride film 1210, and the interlayer insulation film 1211. The contact 1307 is made of polysilicon doped with an N-type impurity and has formed on its side surfaces sidewalls 1306 made up of a silicon nitride film.

As shown in FIG. 13, the following components are also formed: the etching stop film 1214, the interlayer insulation film 1215, the dielectric film 1217, the cell plate 1218, the interlayer insulation film 1219, the barrier metal 1220, the upper contact 1221, and the first wire 1222. These components are the same as those shown in FIG. 12.

Figure 14:
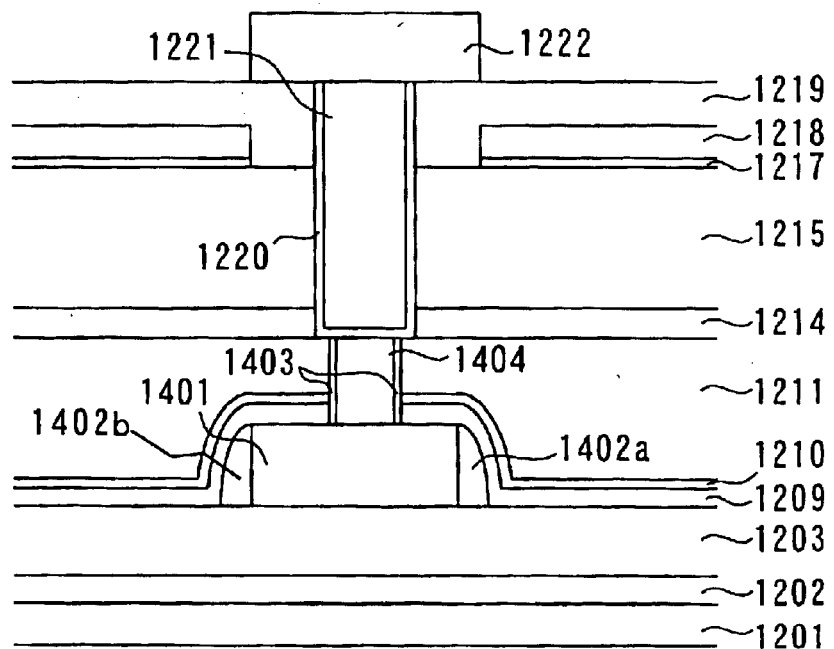
FIG. 14 shows a semiconductor device according to the sixth embodiment.

FIG. 14 is a cross-sectional view of the T-CAM cell in FIG. 11 taken along line D–D', indicating the gate contact portion of search transistors. It should be noted that the components in FIG. 14 which are the same as those shown in FIG. 12 are denoted by like numerals.

The P-well region 1202 and the separation insulation film 1203 are sequentially formed on the P-type semiconductor substrate 1201, and a gate electrode 1401 is formed in a predetermined area on the separation insulation film 1203. Sidewalls 1402a and 1402b are formed on side surfaces of the gate electrode 1401.

The silicide protection film 1209, the nitride film 1210, and the interlayer insulation film 1211 are sequentially formed on the separation insulation film 1203, the sidewalls 1402a and 1402b, and the gate electrode 1401. Furthermore, a contact 1404 of polysilicon doped with an N-type impurity is formed in these films, and contact sidewalls 1403 made up of a silicon nitride film are formed on side surfaces of the contact 1404.

Further, the upper contact 1221 is formed on the top of the contact 1404, forming a stacked contact structure.

As shown in FIG. 14, the following components are also formed: the etching stop film 1214, the interlayer insulation film 1215, the dielectric film 1217, the cell plate 1218, the interlayer insulation film 1219, the barrier metal 1220, and the first wire 1222. These components are the same as those shown in FIG. 12.

The components of the present embodiment such as insulation films, gate electrodes, and interlayer insulation films are not limited to the materials indicated in the above description of the present embodiment. Appropriate materials may be selected according to circumstances.

According to the present embodiment, a common contact can be used to connect between a T-CAM storage node, a search gate, and a diffusion layer, making it possible to reduce the cell area. Further, it is possible to reduce the decrease in the yield due to the formation of insufficiently opened contacts in the semiconductor manufacturing process. Still further, it is possible to reduce the occurrence of defects such as wire shorts and breakages and thereby increase the yield.

Still further, since the present embodiment has a stacked contact structure in which a contact connected with a metal wire is formed on the top of a contact connected with a diffusion layer or a gate electrode, it is possible to reduce the proportion of the area occupied by the contact holes and thereby further reduce the cell area.

Seventh Embodiment

A seventh embodiment of the present invention will be described with reference to FIGS. 15 to 17.

The present embodiment is characterized in that diffusion layers, gate electrodes, and capacitors are formed in a memory cell region made up of T-CAM cells on a semiconductor substrate. Furthermore, a silicide layer is formed within a T-CAM memory cell.

The layout of the T-CAM of the present embodiment is the same as that of the sixth embodiment shown in FIG. 11.

Figure 15:
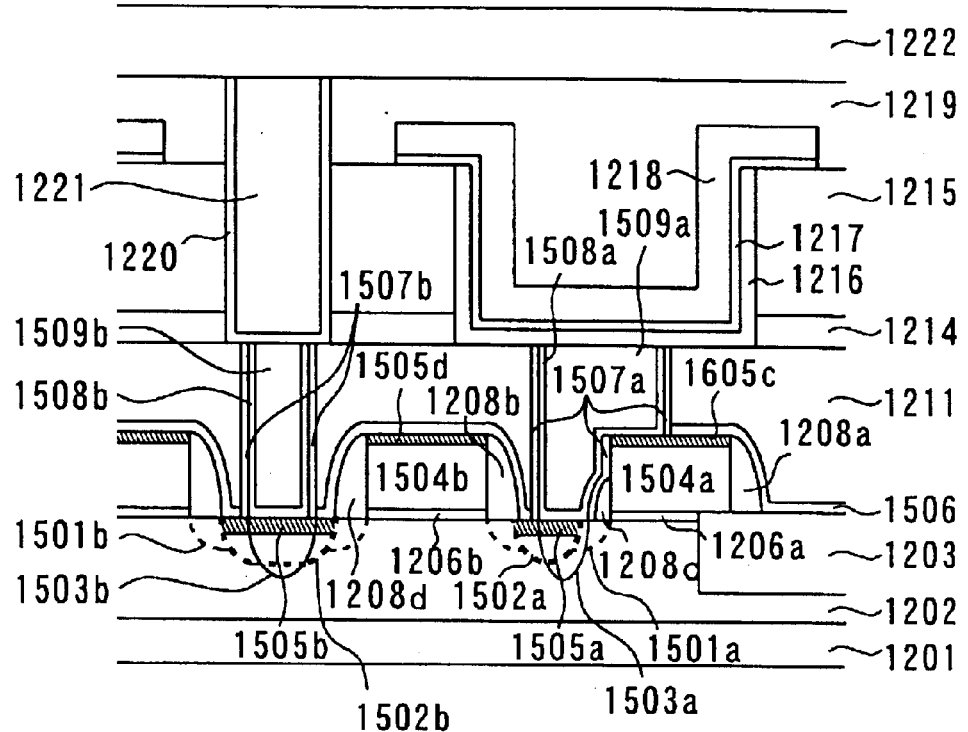
FIG. 15 shows a semiconductor device according to the seventh embodiment.
Figure 16:
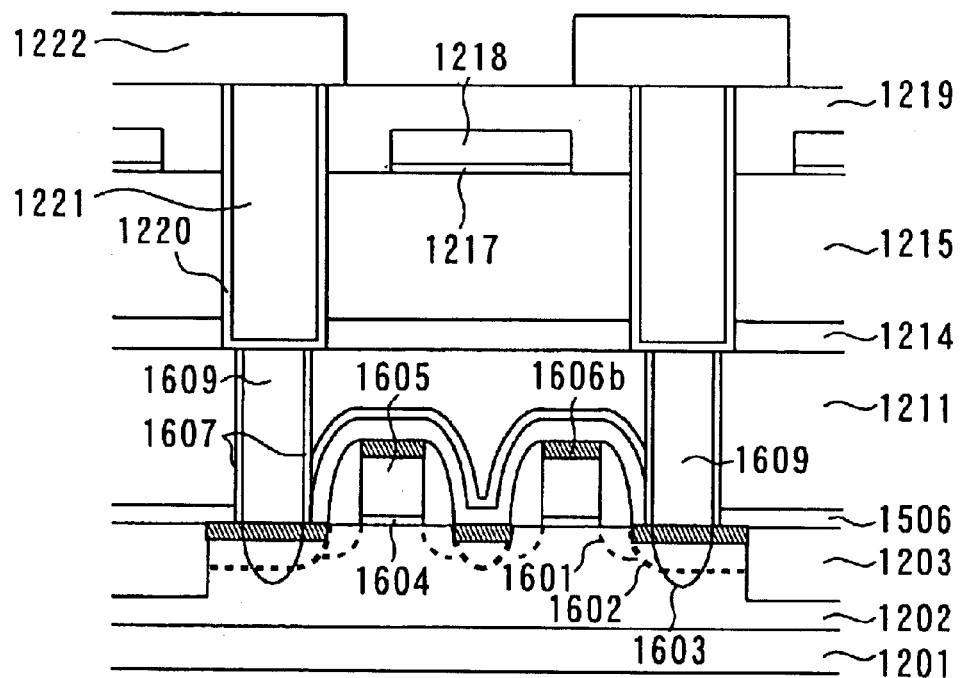
FIG. 16 shows a semiconductor device according to the seventh embodiment.

FIG. 15 is a cross-sectional view of the T-CAM cell in FIG. 11 taken along line B–B', while FIG. 16 is a cross-sectional view of the T-CAM cell in FIG. 11 taken along line C–C'. Furthermore, FIG. 17 is a cross-sectional view of the T-CAM cell in FIG. 11 taken along line D–D'. It should be noted that the components in these figures which are the same as those in FIGS. 12 to 14 are denoted by like numerals.

The present embodiment is characterized in that the inside of the T-CAM memory cell is cobalt-silicified ($CoSi_2$). It should be noted that the present embodiment is not limited to a particular type of silicide layer such as a cobalt silicide layer. Another metal silicide layer may be employed.

FIG. 15 shows a portion of the DRAM which includes memory cell transistors and a capacitor.

As shown in FIG. 15, the semiconductor device of the present embodiment includes the P-well region 1202, the separation insulation film 1203, N⁻-type diffusion layers 1501a and 1501b and N⁺-type diffusion layers 1502a and 1502b for memory transistors, N-type diffusion layers 1503a and 1503b, gate insulation films 1206a and 1206b, gate electrodes 1504a and 1504b, cobalt silicide layers 1505a and 1505b on the diffusion layers 1502a and 1502b, cobalt silicide layers 1505c and 1505d on the gate electrodes 1504a and 1504b, the sidewalls 1208a, 1208b, 1208c, and 1208d, the interlayer insulation film 1211, and contacts 1509a and 1509b which are all formed above the P-type semiconductor substrate 1201.

The N-type diffusion layers 1503a and 1503b are formed as a result of implanting an N-type impurity after forming the contact holes at the time of the formation of the contacts 1213a and 1213b.

In FIG. 15, the gate electrodes 1504a and 1504b correspond to gate wiring portions for transmitting data stored in the storage node to the search transistors. The gate electrode 1207b, on the other hand, is the gate of a DRAM memory cell transistor. The gate electrodes 1504a and 1504b are made of, for example, polysilicon doped with an N-type impurity.

The sidewalls 1208a to 1208d are made up of a silicon oxide film, a silicon nitride film, a silicon oxynitride film, etc. In the example shown in FIG. 15, the sidewall 1208c is smaller than the other sidewalls 1208a, 1208b, and 1208d, which is a result of etching at the time of the formation of the contact 1509a. Thus, according to the present embodiment, the sidewall 1208c can be of any size. The sidewall 1208c may have the same size as that of the other sidewalls 1208a, 1208b, and 1208d. Or the sidewall 1208c may be removed completely through etching.

An etching stop layer 1506 made up of a silicon nitride film is formed on the portion including the gate electrodes 1504a and 1504b and the sidewalls 1208a, 1208b, and 1208d and excluding the contacts 1509a and 1509b. The interlayer insulation film 1211 is formed on the etching stop layer 1506. The contacts 1509a and 1509b of tungsten (W) are formed in the interlayer insulation film 1211. Sidewalls 1507a and 1507b are formed between the contacts 1509a and 1509b and the interlayer insulation film 1211. Furthermore, barrier metals 1508a and 1508b of titanium nitride (TiN) are formed on the inside walls of the contacts 1509a and 1509b.

Further, the etching stop film 1214 made up of a silicon nitride film is formed in a predetermined area on the interlayer insulation film 1211, and the interlayer insulation film 1215 made up of a silicon oxide film is formed on the etching stop film 1214. The etching stop film 1214 is provided to stop etching of the silicon oxide film at the time of forming the storage node or upper contacts.

A storage node 1216 of polysilicon doped with an N-type impurity whose surface is roughened is formed in predetermined areas on the contacts 1509a and 1509b and the interlayer insulation film 1211. The dielectric film 1217 of Ta₂O₅ is formed in predetermined areas on the storage node 1216 and the interlayer insulation film 1215. The cell plate 1218 is formed on the dielectric film 1217.

The interlayer insulation film 1219 is formed over the cell plate 1218 and the interlayer insulation film 1215.

Further, the upper contact 1221 of tungsten (W) is formed in the interlayer insulation film 1219. The present embodiment is characterized in that it has a stacked contact structure in which the upper contact 1221 is disposed on the top of the contact 1509b. Furthermore, barrier metal 1220 is formed on the inside walls of the upper contact 1221. The upper contact 1221 is directly connected with diffusion layers and gate electrodes in peripheral logic portions. The first wire (metal wire) 1222 of aluminum (Al) or copper (Cu) is formed on the interlayer insulation film 1219 and the upper contact 1221.

FIG. 16 shows a portion in which search transistors are connected in series. It should be noted that the components in FIG. 16 which are the same as those in FIG. 15 are denoted by like numerals.

The P-well region 1202 formed on the P-type semiconductor substrate 1201 has formed therein an N⁻-type diffusion layer 1601, an N⁺-type diffusion layer 1602, and an N-type diffusion layer 1603. The N⁺-type diffusion layer is formed in addition to the N⁻-type diffusion layer, since each search transistor portion must have transistor driving capability and there is little concern over the leakage. The N-type diffusion layer 1603 is disposed under a contact 1609 and formed as a result of implanting an N-type impurity in the P-well region 1202 at the time of forming the contact hole.

The gate insulation films 1604 of the search transistors are formed in predetermined areas on the P-well region 1202. The gate electrodes 1605 of the search transistors are formed on the gate insulation films 1604. The gate electrodes 1605 are made of polysilicon doped with an N-type impurity.

A cobalt silicide layer 1606a is formed on the top of the N⁺-type diffusion layer 1602, while cobalt silicide layers 1606b are formed on the gate electrodes 1605.

Further, the separation insulation film 1203 is also formed in the P-well region 1202, and the etching stop layer 1506 made up of a silicon nitride film is formed in predetermined areas on the separation insulation film 1203 and the cobalt silicide layer 1606a. The interlayer insulation film 1211 is formed on the etching stop layer 1506, and the contact 1609 of contact tungsten is formed in the interlayer insulation film 1211. Sidewalls 1607 are formed between the contact 1609 and the interlayer insulation film 1211. Furthermore, barrier metal of titanium nitride (TiN) is formed on the inside walls of the contact 1609.

As shown in FIG. 16, the following components are also formed: the etching stop film 1214, the interlayer insulation film 1215, the dielectric film 1217, the cell plate 1218, the interlayer insulation film 1219, the barrier metal 1220, the upper contact 1221, and the first wire 1222. These components are the same as those shown in FIG. 12.

Figure 17:
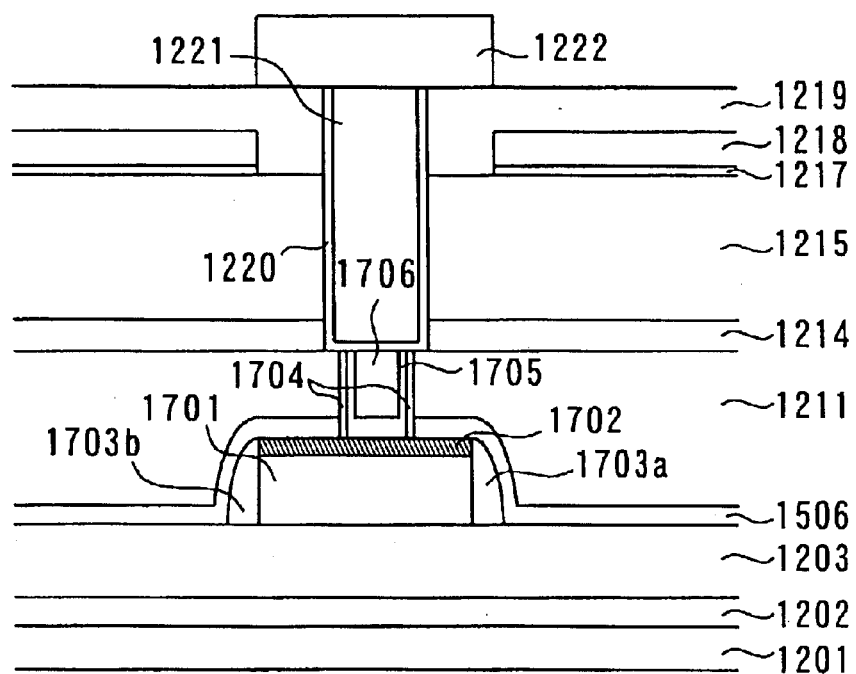
FIG. 17 shows a semiconductor device according to the seventh embodiment.
Figure 18:
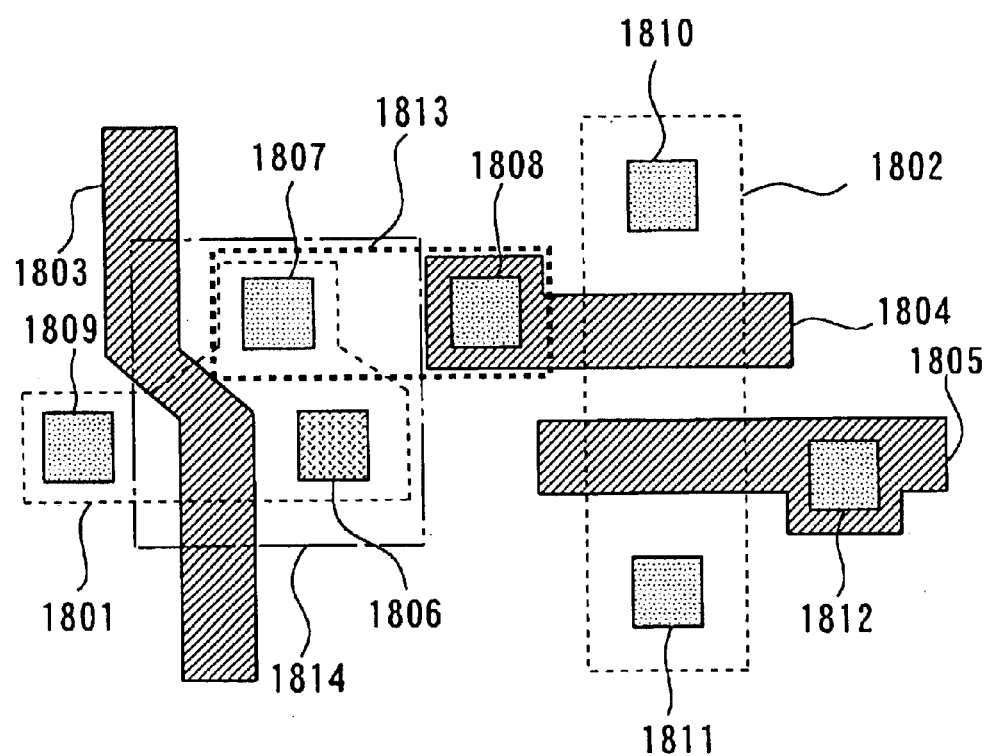
FIG. 18 shows a conventional semiconductor device.

FIG. 17 shows the gate contact portion of search transistors. It should be noted that the components in FIG. 17 which are the same as those shown in FIG. 15 are denoted by like numerals.

The P-well region 1202 and the separation insulation film 1203 are sequentially formed on the P-type semiconductor substrate 1201, and a gate electrode 1701 is formed in a predetermined area on the separation insulation film 1203. A cobalt silicide layer 1702 is formed on the top of the gate electrode 1701, while sidewalls 1703a and 1703b are formed on side surfaces of the gate electrode 1701.

The etching stop layer 1506 made up of a silicon nitride film is formed on the separation insulation film 1203, the sidewalls 1703a and 1703b, and the cobalt silicide film 1702. Furthermore, the interlayer insulation film 1211 is formed on the etching stop layer 1506, and a contact 1706 of tungsten is formed in the interlayer insulation film 1211 and the etching stop layer 1506. Sidewalls 1704 made up of a silicon nitride film are formed between the contact 1706 and the interlayer insulation film 1211. Barrier metal 1705 of titanium nitride is formed on the inside walls of the contact 1706.

Further, the upper contact 1221 is formed on the top of the contact 1706, forming a stacked contact structure.

According to the present embodiment, DRAM memory cells can be silicified to reduce the resistance of the device and thereby increase the data write/read speed. Furthermore, the search transistor portion also can be silicified to increase the search speed, making it possible to provide a semiconductor device including a high-performance T-CAM chip.

Further, according to the present embodiment, a single contact can be used to connect between a T-CAM storage node and a search gate, making it possible to reduce the cell area and reduce the decrease in the yield due to the formation of insufficiently opened contacts in the semiconductor manufacturing process.

Still further, since the present embodiment has a stacked contact structure in which a contact connected with a metal wire is formed on the top of a contact connected with a diffusion layer or a gate electrode, it is possible to reduce the proportion of the area occupied by the contact holes and thereby further reduce the cell area.

The features and advantages of the present invention may be summarized as follows.

According to one aspect, a common contact can be used to connect between a diffusion layer, a gate electrode, and a capacitor lower electrode in the present invention. Therefore it is possible to reduce the cell area.

According to another aspect, the present invention only needs to form a single contact hole. Therefore it is possible to reduce the decrease in the yield due to the formation of insufficiently opened contacts in the semiconductor manufacturing process.

According to other aspect, only a single contact needs to be employed in the present invention. This eliminates the wires for connecting contacts, which are required by the prior art techniques. Therefore it is possible to reduce the occurrence of defects such as wire shorts and breakages in the semiconductor manufacturing process and thereby increase the yield.

Obviously many modifications and variation of the present invention are possible in the light of the above teachings. It is therefore to be understood that within the scope of the appended claims the invention may by practiced otherwise than as specifically described.

The entire disclosure of a Japanese Patent Application No. 2003-001501, filed on Jan. 7, 2003 including specification, claims, drawings and summary, on which the Convention priority of the present application is based, are incorporated herein by reference in its entirety.

What is claimed is:

1. A semiconductor device comprising:
a semiconductor substrate;
a diffusion region in said semiconductor substrate;
a gate insulation film on said semiconductor substrate;
a gate electrode on said gate insulation film;
an interlayer insulation film on said semiconductor substrate covering said gate electrode;
a capacitor on said interlayer insulation film and having a laminated structure including a lower electrode, a dielectric film, and an upper electrode; and
a common contact in said interlayer insulation film and connecting said diffusion region, said gate electrode, and said lower electrode.

2. The semiconductor device according to claim 1, wherein the portion of said common contact in contact with said diffusion region has an area larger than the portion of said common contact in contact with an upper surface of said gate electrode.

3. The semiconductor device according to claim 1, including a sidewall on a side surface of said common contact.

4. The semiconductor device according to claim 1, including a sidewall on each of opposite sides of said gate electrode and said gate insulation film.

5. The semiconductor device according to claim 1, wherein upper surfaces of said diffusion region and said gate electrode are silicided.

6. The semiconductor device according to claim 1, including a diffusion region in a P-well region at a bottom of said common contact.

7. The semiconductor device according to claim 1, wherein said semiconductor device has a stacked contact structure in which a contact connected to a metal wire is above a contact connected to at least one of said diffusion region in said semiconductor substrate and a gate electrode on a separation insulation film on said semiconductor substrate.

8. The semiconductor device according to claim 1, wherein said diffusion region, said gate electrode, and said capacitor are in a memory cell region of said semiconductor substrate.

9. The semiconductor device according to claim 8, wherein said memory cell is a Ternary Content Addressable Memory.

10. A method for manufacturing a semiconductor device comprising:
forming a P-well region in a semiconductor substrate;
forming a gate insulation film on said P-well region;
forming a gate electrode on said gate insulation film;
forming a diffusion region in said P-well region on each of opposite sides of said gate electrode, said diffusion region being a source/drain region;
forming a first sidewall on each of opposite sides of said gate electrode and said gate insulation film;
depositing an insulating film on said diffusion region thereby producing an interlayer insulation film covering said gate electrode and said first sidewall;
etching said interlayer insulation film to form a contact hole reaching said diffusion region and said gate electrode;
filling said contact hole with polysilicon containing a dopant impurity to form a contact; and
laminating a lower electrode, a dielectric film, and an upper electrode on said contact, in that order, to form a capacitor.

11. The method for manufacturing a semiconductor device according to claim 10, further comprising forming a second sidewall inside said contact hole.

12. The method for manufacturing a semiconductor device according to claim 10, including forming said contact hole by selectively removing said interlayer insulation film and leaving said first sidewall.

13. The method for manufacturing a semiconductor device according to claim 10, further comprising forming a diffusion region in said P-well region at a bottom of said contact hole.

14. A method for manufacturing a semiconductor device comprising:
forming a P-well region in a semiconductor substrate;
forming a gate insulation film on said P-well region;
forming a gate electrode on said gate insulation film;

forming a shallow diffusion region in said P-well region on each of opposite sides of said gate electrode, said shallow diffusion region being a source/drain region;

forming a sidewall on each of opposite sides of said gate electrode and said gate insulation film after forming said shallow diffusion region;

forming a deep diffusion region in said P-well region on each of opposite sides of said sidewall, said deep diffusion region being a source/drain region;

siliciding tops of said deep diffusion region and said gate electrode;

depositing an insulating film on said deep diffusion region, thereby obtaining an interlayer insulation film covering said gate electrode and said sidewall;

etching said interlayer insulation film to form a contact hole reaching said deep diffusion region and said gate electrode;

forming a barrier metal layer inside said contact hole;

filling said contact hole with tungsten to form a contact; and laminating a lower electrode, a dielectric film, and an upper electrode on said contact, in that order, to form a capacitor.

15. The method for manufacturing a semiconductor device according to claim 14, wherein forming said contact hole includes selectively removing said interlayer insulation film and leaving said sidewall.

16. The method for manufacturing a semiconductor device according to claim 14, further comprising forming a diffusion region in said P well region at a bottom of said contact hole.

* * * * *